United States Patent
Nagata

(10) Patent No.: US 10,181,352 B2
(45) Date of Patent: Jan. 15, 2019

(54) MEMORY SYSTEM AND METHOD OF CONTROLLING NONVOLATILE MEMORY

(71) Applicant: Toshiba Memory Corporation, Minato-ku (JP)

(72) Inventor: Yuki Nagata, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 134 days.

(21) Appl. No.: 15/050,760

(22) Filed: Feb. 23, 2016

(65) Prior Publication Data

US 2017/0068615 A1 Mar. 9, 2017

Related U.S. Application Data

(60) Provisional application No. 62/215,905, filed on Sep. 9, 2015.

(51) Int. Cl.
| | |
|---|---|
| G06F 12/00 | (2006.01) |
| G11C 16/26 | (2006.01) |
| G06F 12/02 | (2006.01) |
| G06F 12/12 | (2016.01) |
| G06F 12/10 | (2016.01) |
| G06F 9/50 | (2006.01) |
| G11C 16/04 | (2006.01) |

(52) U.S. Cl.
CPC ............ *G11C 16/26* (2013.01); *G06F 9/5022* (2013.01); *G06F 12/00* (2013.01); *G06F 12/0246* (2013.01); *G06F 12/10* (2013.01); *G06F 12/12* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 7,983,171 B2* | 7/2011 | Coronado | G06F 11/076 370/241 |
| 9,368,223 B2* | 6/2016 | Jung | G06F 12/0253 |
| 2009/0006719 A1 | 1/2009 | Traister | |
| 2010/0042795 A1* | 2/2010 | Uchida | G06F 3/0619 711/162 |
| 2010/0287217 A1 | 11/2010 | Borchers et al. | |

FOREIGN PATENT DOCUMENTS

JP  2011-227835  11/2011

* cited by examiner

*Primary Examiner* — Midys Rojas
(74) *Attorney, Agent, or Firm* — Oblon, McClelland, Maier & Neustadt, L.L.P.

(57) ABSTRACT

According to one embodiment, when a garbage collection end request is received from a host during the execution of garbage collection, a controller calculates a first, time that is a time until a second processing being executed is completed. In a case where the calculated first time does not exceed the first threshold, the controller completes the second processing being executed, and stops the first processing.

19 Claims, 5 Drawing Sheets

MEMORY SYSTEM AND METHOD OF CONTROLLING NONVOLATILE MEMORY

CROSS-REFERENCE TO RELATED APPLICATIONS

This application is based upon and claims the benefit of priority from U.S. Provisional Application No. 62/215,905, filed on Sep. 9, 2015; the entire contents of which are incorporated herein by reference.

FIELD

Embodiments described herein relate generally to a memory system including a nonvolatile memory and a method of controlling a nonvolatile memory.

BACKGROUND

A memory system including a flash memory executes garbage collection. The garbage collection is a process in which valid data is collected from a first block in which invalid data is included and the collected valid data is rewritten into a second block.

DETAILED DESCRIPTION

In general, according to one embodiment, a memory system includes a nonvolatile memory and a controller. The nonvolatile memory includes a plurality of blocks. The controller executes a first processing. The first processing includes at least one second processing. The second processing includes reading valid data from a first block of the nonvolatile memory and writing the read valid data into a second block of the nonvolatile memory. The first block is a block including valid data and invalid data among the plurality of blocks. The second block is a block that is different from the first block among the plurality of blocks. During the execution of the first processing, and when a first command is received from a host, the controller calculates a first time. The first command is a command requesting an end of the first processing. The first time is a time until the second processing being executed is completed. In a case where the calculated first time does not exceed the first threshold, the controller completes the second processing being executed, and stops the first processing.

Exemplary embodiments of memory systems and methods of controlling a nonvolatile memory will be explained below in detail with reference to the accompanying drawings. The present invention is not limited to the following embodiments (First Embodiment)

Figure 1:
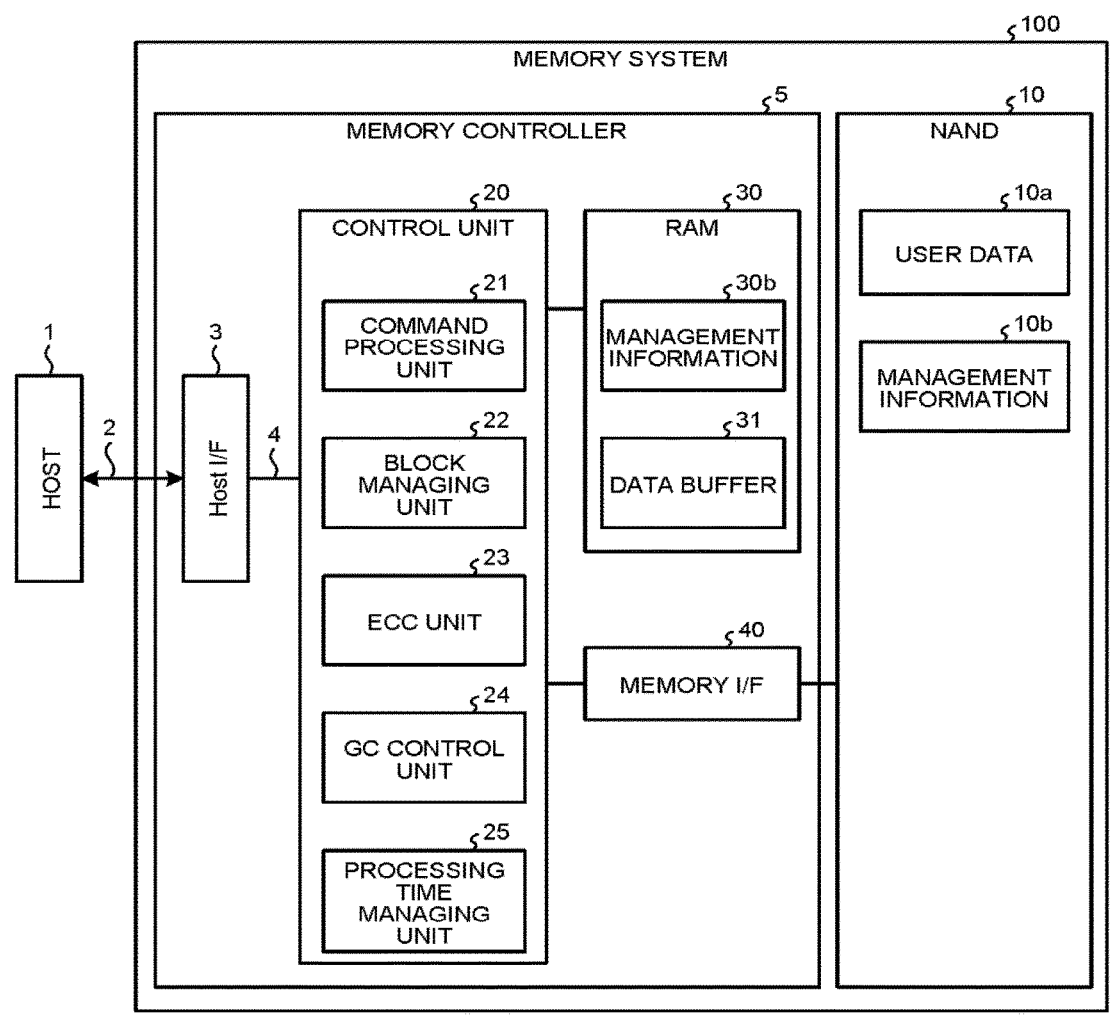
FIG. 1 is a functional block diagram that illustrates the internal configuration of a memory system.

FIG. 1 is a block diagram that illustrates an example of the configuration of a memory system 100 according to a first embodiment. The memory system 100 is connected to a host apparatus 1 (hereinafter, abbreviated as a host) through a communication line 2 and functions as an external storage device of the host 1. The host 1, for example, may be an information processing apparatus such as a personal computer, a mobile phone, or an imaging apparatus, and also may h a mobile terminal such as a tablet computer or a smart phone, a gaming device, or an in-vehicle terminal such as a car navigation system.

The memory system 100, for example, is a solid state drive (SSD). The memory system 100 includes: a NAND flash memory (hereinafter, abbreviated as a NAND) 10 as a nonvolatile memory; and a memory controller 5. The nonvolatile memory is not limited to the NAND flash memory but may be a flash memory having a three-dimensional structure, a resistance random access memory (ReRAM), a ferroelectric random access memory (FeRAM), or the like.

The NAND 10 includes one or more memory chips each including a memory cell array. The memory cell array include a plurality of memory cell arranged in a matrix pattern. The memory cell array includes a plurality of blocks that are units for data erasing. Each block is configured by a plurality of physical sectors MS (see FIG. 2).

Figure 2:
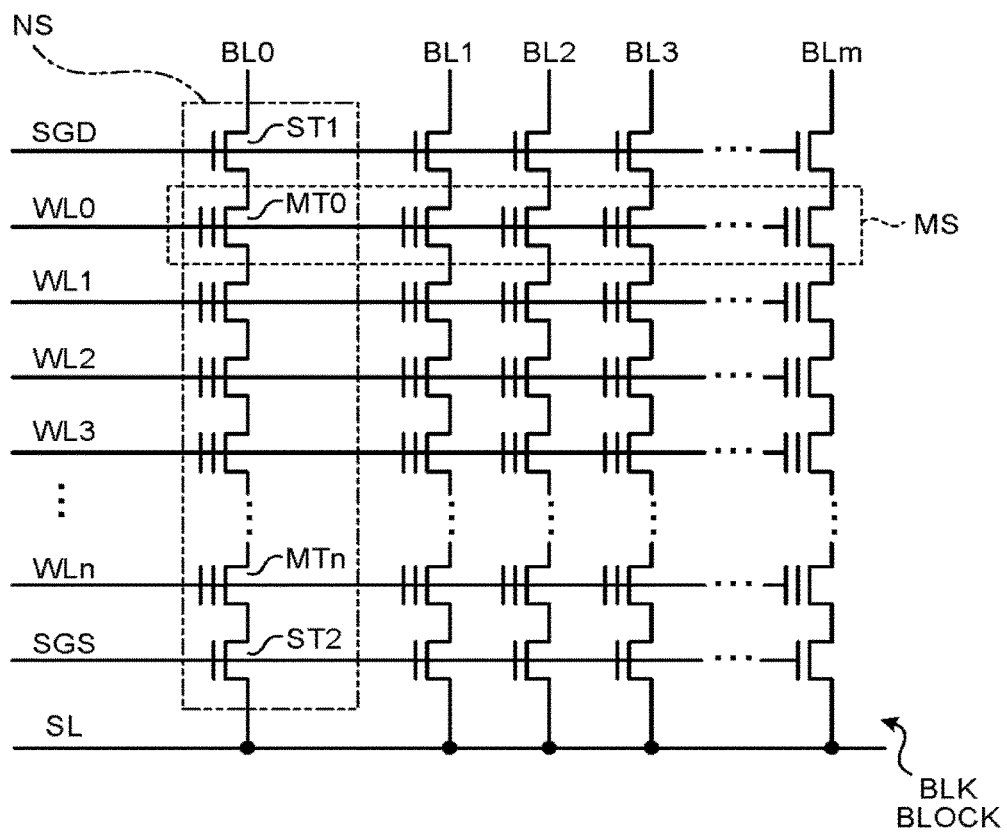
FIG. 2 is a diagram that illustrates an example of the circuit configuration of a memory cell array.

FIG. 2 is a diagram that illustrates an example of the configuration of a block of the memory cell array. FIG. 2 illustrates one of a plurality of blocks that configure the memory cell array. The other blocks of the memory cell array have the same configuration as that illustrated in FIG. 2. As illustrated in FIG. 2, the block BLK of the memory cell array includes (m+1) (here, m is an integer of zero or more) NAND strings NS. Each NAND string NS includes: (n+1) (here, n is an integer of zero or more) memory cell transistors MT0 to MTn that share a diffusion region (a source region or a drain region) and are connected in series between memory cell transistors MT adjacent to each other; and selection transistors ST1 and ST2 that are arranged at both ends of the column of the (n+1) memory cell transistors MT0 to MTn.

Word lines WL0 to WLn are respectively connected to control gate electrodes of the memory cell transistors MT0 to MTn that configure the NAND string NS, and memory cell transistors MTi (here, i=0 to n) included in each NAND string NS are connected to he common using the same word line WLi (here, i=0 to n). In other words, the control gate electrodes of the memory cell transistors MTi disposed in the same row within the block BLK are connected to the same word line WLi.

Each of the memory cell transistors MT0 to MTn is configured by a field effect transistor having a stacked gate structure formed on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an inter-gate insulating film being interposed therebetween. A threshold voltage of each of the memory cell transistors MT0 to MTn changes according to the number of electrons storable in the floating gate electrode and thus, can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the memory cell transistor MT0. Similarly, a source line SL is connected to be common to the sources of the (m+1) selection transistors ST2 within one block BLK, and a selection gate line SGS is connected to be common to the gates of the selection transistors. In addition, the drain of the selection transistor ST2 is connected to the source of the memory cell transistor MTn.

Each memory cell is connected not only to the word line but also to the bit line. Each memory cell can be identified by using an address used for identifying a word line and an address used for identifying a bit line. As described above, the data of a plurality of memory cells (the memory cell transistors MT) disposed within the same block BLK is erased altogether. On the other hand, data is written and read in units of physical sectors MS. One physical sector MS includes a plurality of memory cells connected to one word line.

Each memory cell can perform multi-value storage. In a case where the memory cells are operated in a single level cell (SLC) mode, one physical sector MS corresponds to one page. On the other hand, in a case where the memory cells are operated in a multiple level cell (MLC) mode, one physical sector MS corresponds to N pages (here, N is a natural number of two or more).

In a reading operation and a programming operation, one word line is selected according to the physical address, and one physical sector MS is selected. A switching of the page within this physical sector MS is performed using the physical address.

User data 10a transmitted from the host 1, management information 10b and firmware (not illustrated in the drawing) of the memory system 100, and the like are stored in the NAND 10. The firmware operates a CPU (not illustrated in the drawing) realizing at least some of the functions of a control unit 20 of the memory controller 5 to be described later. The firmware described above maybe stored in a ROM not illustrated in the drawing. The management information 10b described above includes a logical/physical translation table, a block management table, and the like.

The memory controller 5 includes: a host interface 3; a memory interface 40; a RAM 30, and a control unit 20. In this embodiment, while the RAM 30 is arranged inside the memory controller 5, the RAM 30 may be disposed outside the memory controller 5. The host I/F 3 outputs a command, user data (write data), and the like received front the host 1 to an internal bus 4. In addition, the host I/F 3 transmits user data read from the NAND 10, a response from the control unit 20, and the like to the host 1. The memory I/F 40 directly controls the NAND 10 based on an instruction from the control unit 20.

The RAM 30 is a volatile semiconductor memory that can be accessed at a speed higher than that of the NAND 10. The RAM 30 includes a storage area as a data buffer 31. Data received from the host 1 is temporarily stored in the data buffer 31 before being written into the NAND 10. Data read from the NAND 10 is temporarily stored in the data buffer 31 before the transmission thereof to the host 1. The management information 10b stored in the NAND 10 is loaded into the RAM 30. Management information 30b loaded into the RAM 30 is backed up in the NAND 10. The RAM 30 functions also as a buffer in which firmware stored in the NAND 10 is loaded. As the RAM 30, a static random access memory (SRAM) or a dynamic random access memory (DRAM) is used.

The control unit 20 includes: a command processing unit 21; a block managing unit 22; an ECC unit 23, a garbage collection (GC) control unit 24; and a processing time managing unit 25. The function of the control unit 20 is realised by one or a plurality of CPUs (processors) executing the firmware loaded in the RAM 30 and peripheral circuits thereof. The function of the command processing unit 21 is realized by the CPU and/or hardware executing the firmware. The function of the block managing unit 22 is realized by the CPU and/or hardware executing the firmware. The function of the ECC unit 23 is realized by the CPU and/or hardware executing the firmware. The function of the garbage collection (GC) control unit 24 is realized by the CPU and/or hardware executing the firmware. The function of the processing time managing unit 25 is realized by the CPU and/or hardware executing the firmware.

The command processing unit 21 executes a process according to a command received from the host 1. For example, in a case where a write request is received from the host 1, the command processing unit 21 temporarily stores write data into the data buffer 31. For example, when the data buffer 31 is full, the command processing unit 21 reads data stored in the data buffer and writes the read data into the NAND 10 through the ECC unit 23 and the memory I/F 40.

In addition, in a case where a read request is received from the host 1, the command processing unit instructs the memory I/F 40 to read data from the NAND 10. The memory I/F 40 temporarily stores the data read from the NAND 10 into the data buffer 31 through the ECC unit 23. The command processing unit 21 transmits the read data stored in the data buffer 31 to the host 1 through the host I/F 3.

The command processing unit 21 manages the user data by using the logical/physical translation table that is one of the above-described management information 30b loaded in the RAM 30. Mapping associating a logical address specified by the host 1 and a physical address of the RAM 30 or the NAND 10 with each other is registered in the logical/physical translation table. For the logical address, for example, logical block addressing (LBA) is used. The physical address represents a storage position on the RAM 30 or the NAND 10 in which data is stored.

The block managing unit 22 manages blocks included in the NAND 10 by using the block management table that is one of the above-described management information 30b loaded in the RAM 30. In the block management table, for example, the following block management information is managed.

The number of times of erasing data in units of blocks
Information identifying whether a block is an active block or a free block
Block address of a bad block An active block is a block in which valid data is recorded. A free block is a block in which valid data is not recorded. The free block, after data recorded therein is erased, can be reused as an erased block. In description presented here, the term "free block" includes both a block before erasing in which valid data is not recorded and an erased block. The valid data is data that is associated with a logical address, and invalid data is data that is not associated with a logical address. When data is written into the erased block, the block becomes an active block. A bad block is an unusable block that does not normally operate due to various factors.

The ECC unit 23 executes an error correction coding process for data transmitted from the data buffer thereby generating a parity. The ECC unit 23 outputs a code word including the data and the parity to the memory I/F 40. The memory I/F 40 inputs a code word read from the NAND 10 to the ECC unit. 23. The ECC unit 23 executes an error correction decoding process by using the input code word and transmits decoded data to the data buffer 31.

The GC control unit 24 controls garbage collection (compaction). In the memory system 100, in a case where a unit (block) for erasing data and a unit for reading/writing data are different from each other, when a rewriting process for the NAND 10 progresses, blocks are fragmented due to invalid data. When the number of such fragmented blocks increases, the number of usable blocks decreases. Thus, for example, in a case where the number of free blocks of the NAND 10 is less than a certain threshold, the garbage collection (compaction) is executed, whereby the number of free blocks is increased. In the garbage collection, valid data is collected from blocks (GC source blocks) in which the valid data and invalid data are included and is rewritten into another block (GC destination block). As the GC destination block, for example, an erased block, a block in which valid data is written in some pages of an erased block is used. Hereinafter, the garbage collection will be abbreviated as GC.

The GC is a background job that is independently executed by the memory system 100 that is one of devices connected to the host 1, and host 1 is not involved in that operation. For this reason, there is a possibility of disturbing efficient GC control. In addition, when a command (a write command, a read command, or the like) from the host and the GC are overlapped, there is a possibility that the performance expected from the host is not satisfied. Thus, technologies for enabling a host to instruct a device of the start and the end of GC have been developed.

In such technologies, for example, in a case where the number of free blocks is less than a certain threshold, the device notifies the host that the number of free blocks is less than the certain threshold. When such a notification is received, the host transmits a GC execution request including a target number of required free blocks to the device. In addition, in a certain time zone such as a night time zone, the host can transmit a GC execution request including the target number of required free blocks to the device. In response to the GC execution request, the device transmits a response representing an acknowledgement to the host, thereby executing GC. When the target number of free blocks is secured, the device transmits a response representing the end of the GC to the host. In addition, in a case where the target number of free blocks cannot be secured even when a certain time elapses after the start of the GC, when the certain time elapses, the device ends the GC and transmits a response representing the end of the GC to the host.

In such technologies, there are cases where the memory system independently starts GC. In such cases, after transmitting a status checking command to the device, the host can recognize that the memory system is in the middle of execution of the GC based on a response transmitted from the memory system.

Figure 3:
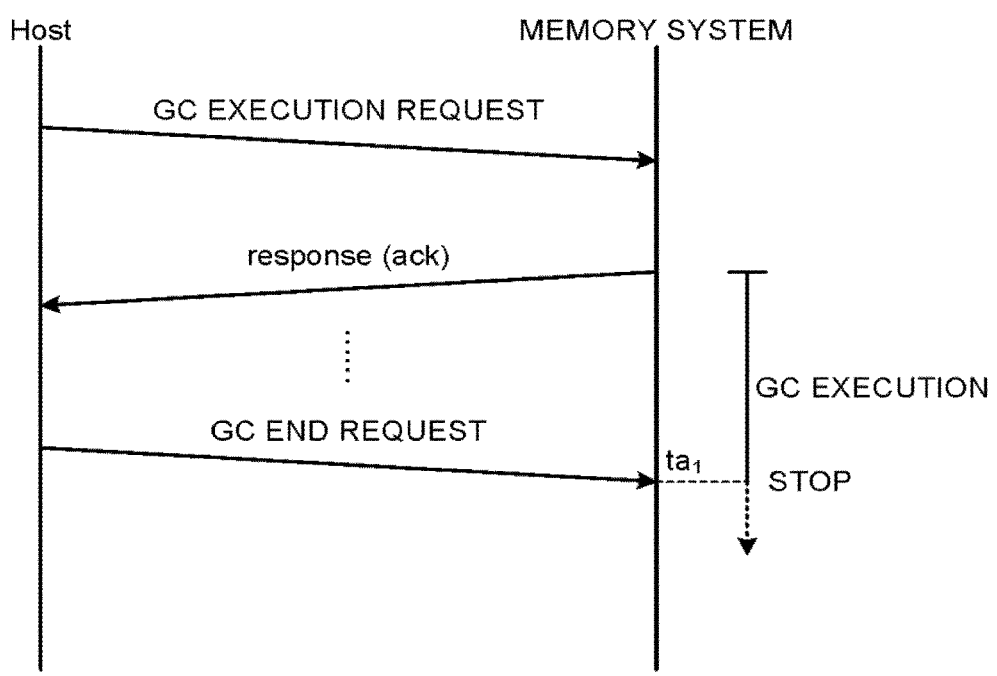
FIG. 3 is a diagram that illustrates an example of a communication protocol between a host and a device.

FIG. 3 is a diagram that illustrates an example of a communication protocol relating to GC between the host 1 and the memory system 100 and the processing state of the GC in the above-described technology. An arrow represented on the right side in FIG. 3 illustrates the processing state of the GC, a solid-line portion corresponds to a state in which the GC is executed, and a dotted-line portion corresponds to a GC process that is planned to be executed but is not executed. First, the host 1 transmits a GC execution request including a target number of secured free blocks to the memory system 100. The memory system 100 transmits a response representing an acknowledgment to the host 1, and starts GC. In the case illustrated in FIG. 3, during the execution of the GC, the host 1 transmits a GC end request to the memory system 100, and the memory system 100 receives this GC end request at time ta1. On the technology described above, a speedy response is required for the GC end request. However, in a case where the GC is stopped at time ta1 in response to this GC end request regardless of the progress state of the GC, there is a possibility that the GC process that has been executed up to the stop point becomes useless. For this reason, after that, in a case where the GC process is re-executed from the start, the wear of the NAND 10 progresses due to a reading process and a programming process, which are useless, included in the GC process that has been executed up to the stop point.

Figure 4:
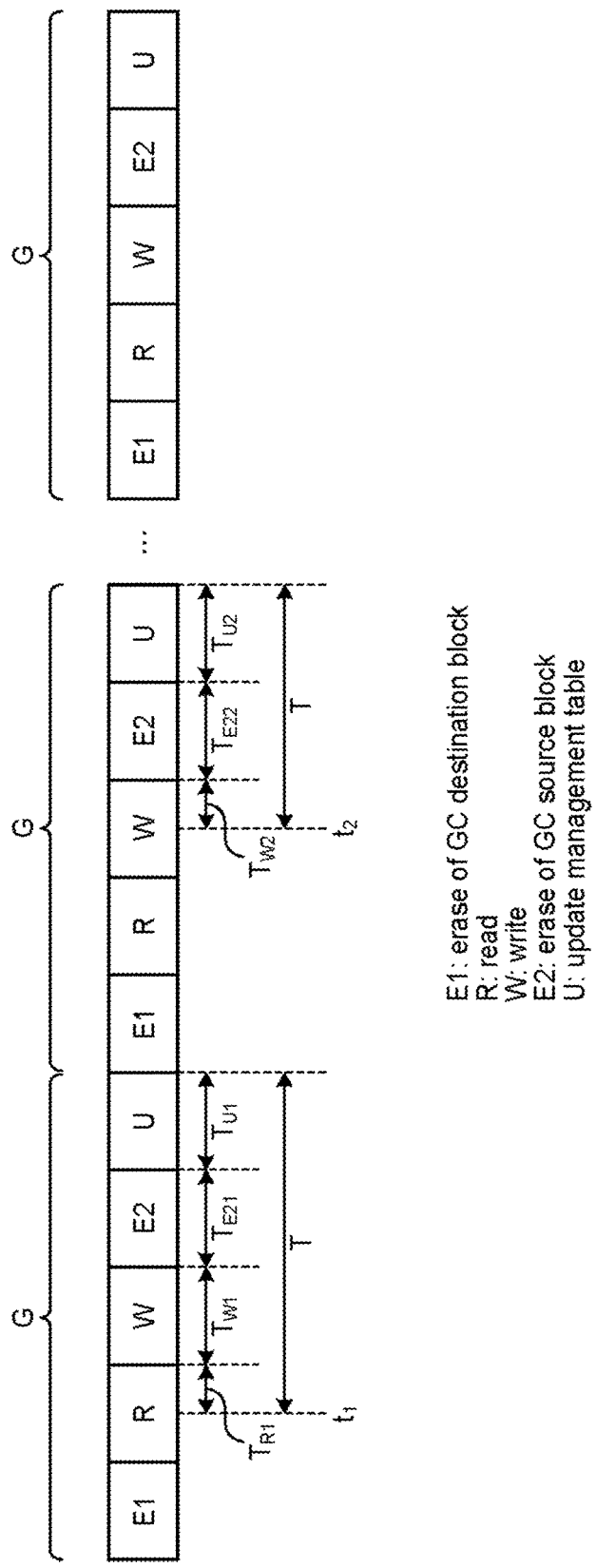
FIG. 4 is a conceptual diagram that illustrates an example of garbage collection.

FIG. 4 is a diagram that conceptually illustrates an example of a GC process. The GC process is completed by executing a basic process G once or a plurality of number of times. The basic process G is configured of a plurality of processing elements. In other words, by executing the basic process G a plurality of number of times, free blocks corresponding to the target number are secured. In the example illustrated in FIG. 4, each basic process G includes five processing elements E1, R, P, E2, and U.

The processing element E1 corresponds to a process of selecting a GC destination block from free blocks before data erasing and erasing the data of the selected GC destination block. According to this processing element E1, an erased block used as the GC destination block is secured.

The processing element R corresponds to a process of reading valid data from one or a plurality of GC source blocks. This processing element R includes reading valid data from source blocks, decoding the read data by using the ECC unit 23, and storing the decoded data into the RAM 30.

The processing element W corresponds to a process of writing data read by the processing element R into one or a plurality of GC destination blocks. The processing element W includes coding valid data stored in the RAM 30 by using the ECC unit 23 and programming the coded data into the GC destination block.

According to the processing element R, the GC source block becomes a free block before data erasing in which valid data is not recorded. The processing element E2 corresponds to a process of erasing data of the GC source block. According to this processing element E2, an erased block is newly secured.

The processing element U corresponds to updating the management information (the logical/physical translation table, the block management table, and the like) accompanied with the execution of the processing elements R, W, E1, and E2. For example, in the logical/physical translation table, a correspondence relation between a physical address at which the data of the GC source is stored and a logical address is invalidated. In addition, a correspondence relation between a physical address at which the data of the GC destination is stored and a logical address is validated. Furthermore, in the block management table, the erase count for the block of which the data has been erased is updated, the GC source block is changed from an active block to a free block, and a GC destination block is changed from a free block to an active block.

In addition, in a case where an erased free block is secured as a GC destination block in advance before the start of GC, the basic process G may be configured by the processing elements R, W, E2, and U by excluding the processing element E1 from the basic process G. Furthermore, since an erased block can be secured also by the processing element E1, the processing element E2 may be excluded from the basic process G. In addition, it may be configured such that the processing element U is excluded from the basic process G, and, after the end of a plurality of the basic processes G, the management information corresponding to the plurality of the basic processes G is updated.

In this way, in the GC process, the basic process G is repeatedly executed. Meanwhile, between the basic process G and the basic process G, a GC end request is not necessarily received from the host 1. For this reason, as described above, in a case where a GC end request is received before one basic process G ends up to the last processing element U, and the GC process is instantly stopped, the basic process G that is in the middle of execution becomes useless, and, when a GC start request is received again, the basic process G of which the GC process is stopped is re-executed from the start. For this reason, erase, read, and write for a block are re-executed, and the wear of the NAND 10 progresses. In addition, when a GC end request is received, in a case where operation is continues until the basic process G ends, there are cases where a long time is required for transmitting a response that represents the end of the GC to the host.

Thus, in the first embodiment, when a GC end request is received from the host, a time T required until the end of the basic process G being executed is predicted and calculated. Then, in a case where the calculated time T is more than a threshold Ta, the GC process is stopped. On the other hand, in a case where the calculated time T is equal to or less than the threshold Ta, the execution of the basic process G that is in the middle of the execution is continued until the basic process G that is in the middle of the execution is completed. In this way, according to the first embodiment, the wear of the NAND 10 accompanied with a GC end request is relieved, and a period from reception of a GC end request to the process end can be suppressed to a certain time or less.

The processing time managing unit 25 manages a processing time TE of the processing element E, a processing time TW of the processing element W, a processing time TR of the processing element R, and a processing time TU of the processing element U. The above-described time T is calculated based on such processing times TE, TW, TR, and TU.

The processing element E corresponds to an erasing process of a block. When the data of a block of the NAND 10 is erased, the processing time managing unit 25 measures an erase time and calculates the processing time TE based on this measured value. For example, the processing time TE may be calculated by, in an initial stage of the use of the memory system, calculating an average erase time of a plurality of blocks and weighting the average erase time using a parameter PE corresponding to the degree of wear of the NAND. In addition, it may be configured such that an average erase time of a plurality of blocks is regularly calculated, and the processing time TE is regularly updated based on a latest average erase time. Furthermore, it may be configured such that ah average erase time of a plurality of blocks is regularly calculated and accumulated, and the processing time TE is regularly updated using a processing time calculated based on a plurality of the average erase times. In addition, it may be regularly repeated to calculate the processing time TE by calculating an average erase time of a plurality of blocks and weighting the calculated averaged erase time using the parameter PE corresponding to the degree of wear of the NAND. Instead of the average erase time, a maximum erase time may be used. The parameter PE corresponding to the degree of wear, for example, is the accumulated number of times of erasing data or the accumulated number of times of writing data.

The processing element W, as described above, corresponds to a writing process and includes a coding process executed by the ECC unit 23 and a programming process for the NAND 10. For example, when a write command is received from the host 1 or when data is written into the NAND 10 in another process, the processing time managing unit 25 measures a processing time for coding that is executed by the ECC unit 23 and a programming processing time for the NAND 10 and calculates the processing time TW based on such measured values. The processing time TW corresponds to a writing processing time for a certain amount of data. The certain amount of data, for example, is a data amount corresponding to a page or a data amount corresponding to a block. For example, the processing time TW of a page size may be calculated by, in the initial stage the use of the memory system, calculating an average coding time and an average programing time for a plurality of pages and weighting the average coding time and the average programing time using a parameter PW corresponding to the degree of wear of the NAND. In addition, it may be configured such that an average coding time and an average programming time are regularly calculated for a plurality of pages, and the processing time TW is regularly updated with a processing time calculated based on a latest average coding time and a latest average programming time. Furthermore, it may be configured such that an average coding time and an average programing time for a plurality of paves are regularly calculated, and the processing time TW is regularly updated with a processing time calculated based on a plurality of average coding times and a plurality of average programing times. In addition, it may be regularly repeated to calculate the processing time TW by calculating an average coding time and an average programming time for a plurality of pages and weighting the average coding time and the average programming time, which have been calculated, by using a parameter PW corresponding to the degree of wear of the NAND. Instead of the average coding time described above, a maximum coding time may be used. In addition, instead of the average programming time described above, a maximum programming time may be used. The parameter PW corresponding to the degree of wear described above, for example, is the accumulated number of times of erasing data, the accumulated number of times of writing data, an error rate of the ECC unit 23, or the like.

The processing element R, as described above, corresponds a reading process and includes a reading process reading data from the NAND 10 and a decoding process executed by the ECC unit 23. For example, when a read command is received from the host 1 or when data is read for the NAND 10 in another process, the processing time managing unit 25 measures a reading processing time from the NAND 10 and a processing time of decoding executed in the ECC unit 23 and calculates a processing time TR based on the measured values. The processing time TR corresponds to a reading processing time for a certain data amount. The certain amount of data, for example, is a data amount corresponding to a page or a data amount corresponding to a block. For example, the processing time TR of a page size may be calculated by, in the initial stage of the use of the memory system, calculating an average read time and an average decoding time for a plurality of pages and weighting the average read time and the average decoding time using a parameter PR corresponding to the degree of wear of the NAND. In addition, it may be configured such that an average read time and an average decoding time are regularly calculated for a plurality of pages, and the processing time TR is regularly updated with a processing time calculated based on latest average read time and a later decoding time. Furthermore, it may be configured such that an average read time and an average decoding time for a plurality of pages are regularly calculated, and the processing time TR is regularly updated with a processing time calculated based or a plurality of average read time, and a plurality of average decoding times. In addition, it may be regularly repeated to calculate the processing time TR by calculating an average read time and an average decoding time for a plurality of pages and weighting the average read time and the average decoding time, which have been calculated, by using a parameter PR corresponding to the degree of wear of the NAND. Instead of the average decoding time described above, a maximum decoding time may be used. Instead of the average read time described above, a maximum read time may be used. The parameter PR corresponding to the degree of wear described above, for example, is the accumulated number of times of erasing data, the accumulated number of times of reading data, an error rate of the ECC unit execution/no-execution of a search process of a read voltage, or the like.

The processing element U, as described above, corresponds to the update of the management information. For example, when a write command is received from the host 1 or when the management information is updated in another process, the processing time managing unit 25 measures an update time of the management information and calculates a processing time TU based on such a measured value. The processing time TU corresponds to an update time of the management information for a certain data amount. The certain data amount, for example, is a data amount corresponding to a page or a data amount corresponding to a block. For example, in the initial stage of the use of the memory system, an average update time of the management information for a plurality of pages is calculated, and the calculated update time is used as the processing time TU.

Figure 5:
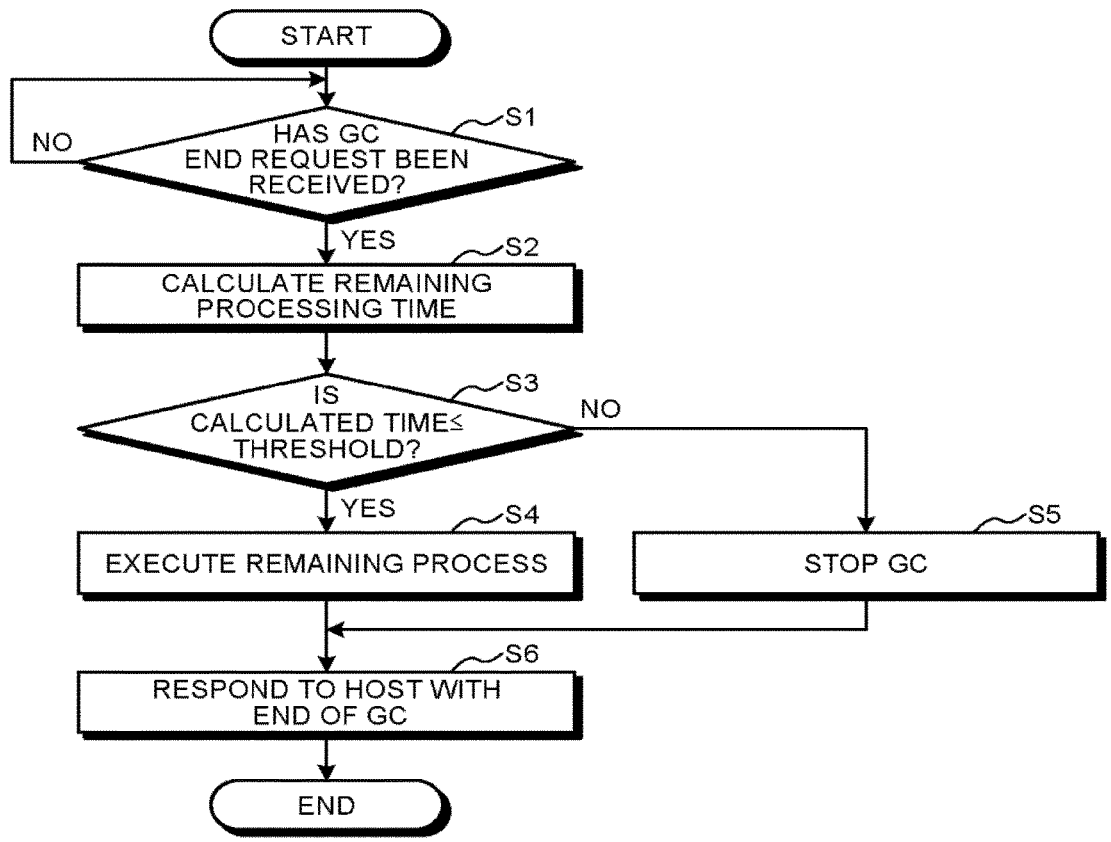
FIG. 5 is a flowchart that illustrates an example of the operation of a memory system according to a first embodiment that is executed when a garbage collection end request is received.

FIG. 5 is a flowchart that illustrates an example of the operation of the memory system 100 according to the first embodiment that is executed when a GC end request is received from the host 1. When a GC end request is received during the execution of GC (Step S1: Yes), the GC control unit 24 predicts and calculates a required time (remaining time) T until the end of the basic process G that is currently in the middle of execution based on the progress state of the GC at the reception time point and the processing times TE, TW, TR, and TU of the processing elements E, W, R, U managed by the processing time managing unit 25 (Step S2). The progress state of the GC represents a processing element among a plurality of processing elements included in the basic process G up to which the process has progressed.

For example, when a GC end request is received at time t1 illustrated in FIG. 4, currently, the processing element R is in the middle of execution, and, in order to end the basic process G, it is necessary to execute the processing elements R, W, E2, and U. The GC control unit 24 calculates a time TR1 until the end of the processing element R based on the processing time TR and the processing size (the size of read data) of the processing element R. In addition, the GC control unit 24 calculates a time TW1 until the end of the processing element W based on the processing time TW and the processing size (the size of write data) of the processing element W. Furthermore, the GC control unit 24 calculates a time TE21 until the end of the processing element E2 based on the processing time TE and the processing size (the size of erase data) of the processing element E. In addition, the GC control unit 24 calculates a time TU1 until the end of the processing element U based on the processing time TU and the processing size (the size of update data) of the processing element U. The GC control unit 24 calculates the remaining time T by adding the calculated times TR1, TW1, TE21, and TU1.

In addition, for example, when a GC end request is received at time t2 illustrated in FIG. 4, currently, the processing element W is in the middle of execution, and, in order to end the basic process G, it is necessary to execute the processing elements W, E2, and U. The GC control unit 24, as described above, calculates a time TW2 until the end of the processing element W, a time TE22 until the end of the processing element E2, and a time TU2 until the end of the processing element U. The GC control unit 24 calculates a remaining time T by adding the calculated times TW2, TE22, and TU2.

The GC control unit 24 compares the calculated time I with the threshold Ta (Step S3). This threshold Ta is set in the memory system 100. In a case where the time T is more than the threshold Ta (Step S3: No), the GC control unit 24 stops the GC (Step SS) and notifies the end of the GC to the host 1 (Step 6). On the other hand, in a case where the time T is equal to or less than the threshold Ta, the GC control unit 24 continuously execute the basic process G that is in the middle of the execution until the end of the basic process G that is in the middle of the execution (Step S4). After the end of this basic process G, the GC control unit 24 responds to the host 1 with an end of GC (Step S6).

In this way, according to the first embodiment, when a GC end request is received from the host, the time T until the end of the basic process G being executed is predicted and calculated. In a case where the calculated time T is more than the threshold Ta, the GC process is instantly stopped. On the other hand, in a case where the calculated time T is equal to or less than the threshold Ta, until the basic process G being executed is completed, the basic process G being executed is continuously executed. That is, in a case where the calculated time T does not exceed the threshold Ta, the basic process G being executed is completed, and the GC process is stopped. In a case where the calculated time T exceeds the threshold Ta, the GC process is stopped without completing the basic process G being executed. Thus, according to the first embodiment, the wear of the NAND 10 accompanied with a GC end request is relieved, and a period from reception of a GC end request to the process end can be suppressed to be within a certain time.

The threshold Ta may be set based on communication between the host 1 and the memory system 100. In addition, the threshold Ta may be included in a GC end request transmitted from the host 1. When a GC end request is received from the host 1 again during continuous execution of a basic process G after the reception of a GC end request, the continuation of the basic process G may be stopped. In addition, a switch function for turning on/off the function of calculating the remaining time T and the function of comparing the remaining time T with the threshold Ta may be arranged in the memory system 100. In a case where this switch is in an Off state, when a GC end request is received, GC is stopped instead of continuing the GC.

(Second Embodiment)

Figure 6:
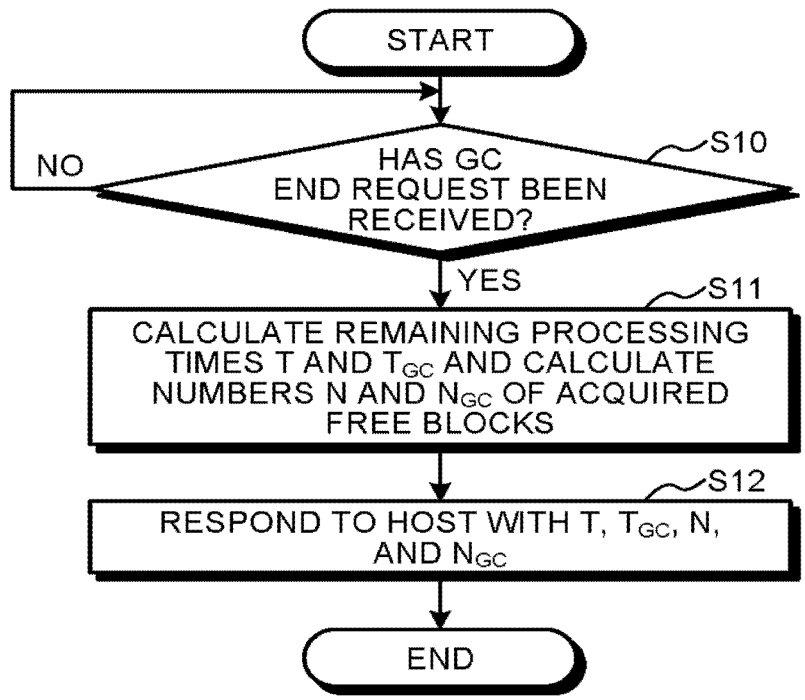
FIG. 6 is a flowchart that illustrates an example of the operation of a memory system according to a second embodiment that is executed when a garbage collection end request is received.

Next, a second embodiment will be described. A memory system 100 according to the second embodiment is similar to the memory system 100 according to the first embodiment illustrated in FIG. 1, and, to a constituent element having the same function as that of the constituent element described above, the same reference numeral as that of the above-mentioned constituent element is attached, and, duplicate description thereof will not be presented. A plurality of constituent elements to which the same reference numeral is attached are not determined that all the functions and characteristics thereof are common but may have functions and characteristics that are different according to embodiments. FIG. 6 is a flowchart that illustrates an example of the operation of the memory system 100 according to the second embodiment that is executed when a GC end request is received from a host 1. When the memory system 100 receives a GC end request during execution of GC (Step S10: Yes), a GC control unit 24 calculates the following values based on the processing state of the GC at the reception time point and the processing times TE, TW, TR, and TU of processing elements E, U, R, and U managed by a processing time managing unit 25 (Step S11).

(1) Required time (remaining time) T until the basic process G being currently executed is completed
(2) Required time (remaining time) TGC until the GC being currently executed is completed up to the end
(3) Number N of free blocks acquired by ending the basic processing currently executed
(4) Number NGC of free blocks acquired by ending the GC being currently executed up to the end When the calculation of such values ends, the GC control unit 24 replies to the host 1 with a response including the calculated times T and TGC and the numbers N and NGC of free blocks (Step S12). Thereafter, the memory system 100 operates according to a command transmitted from the host 1. For example, when a GC end request is received again from the host 1, the GC control unit 24 immediately stops the GC. In addition, in a case where permission to execute a basic process G is received from the host 1, the basic process G that is currently in the middle of execution ends. Furthermore, in a case where permission to execute GC is received from the host 1, the GC ends up to the end. Here, the memory system 100 may calculate all the times T and TGC and the numbers N and NGC of free blocks and notify them to the host 1 or may calculate some thereof and notify them to the host 1.

In this way, in the second embodiment, the time T, the time TGC, the number N of free blocks, and the number NGC of free blocks are notified to the host 1. In addition, the host 1 transmits a command such as a GC end request again based on the content notified from the memory system 100. For this reason, the GC can be efficiently executed in accordance with the states of both the host 1 and the memory system 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a plurality of blocks; and
a controller configured to:
    execute a first process, the first process being a process for a garbage collection and being divided into a plurality of second processes, each said second process including reading valid data from a first block of the nonvolatile memory and writing the read valid data into a second block of the nonvolatile memory, the first block being a block including valid data and invalid data among the plurality of blocks, the second block being a block that is different from the first block among the plurality of blocks,
    during the execution of the first process and one of the plurality of second processes, and in response to a first command received from a host:
        determine a first time, the first command being a command requesting an end of the first process, the first time being a time until said one of the plurality of second processes being executed is completed,
        determine a second time that is a time until the first process is completed,
        determine a first number, the first number being a number of free blocks to be acquired upon completion of the first process, and
        send the determined first time, the determined second time, and the determined first number to the host, and
    in a case where the determined first time does not exceed a first threshold, complete said one second process being executed, and do not execute another second process to abort the first process.

2. The memory system according to claim 1, wherein the controller, after aborting the first process, transmits a response indicating the end of the first process to the host.

3. The memory system according to claim 1, wherein, in a case where the determined first time exceeds the first threshold, abort the first process without completing said one second process being executed.

4. The memory system according to claim 3, wherein the controller transmits a response indicating the end of the first process to the host after aborting the first process without completing said one second process being executed.

5. The memory system according to claim 1, wherein each said second process includes:
reading valid data from the first block of the nonvolatile memory;
writing the read valid data into the second block of the nonvolatile memory; and
erasing data of the first block from which the valid data is read.

6. The memory system according to claim 1,
wherein the controller is further configured to manage a correspondence between a logical address and a physical address of the nonvolatile memory, and
wherein each said second process includes:
reading valid data from the first block of the nonvolatile memory;
writing the read valid data into the second block of the nonvolatile memory;
invalidating a correspondence between a first logical address and a physical address in the first block from which the valid data has been read; and validating a correspondence between the first logical address and a physical address in the second block into which the valid data is written.

7. The memory system according to claim 1, wherein the controller is further configured to determine the first threshold based on a command received from the host.

8. The memory system according to claim 1, wherein the controller is further configured to:
during the execution of said one second process, and in response to the first command received from the host again, abort the first process without completing said one second process being executed.

9. A memory system comprising:
a nonvolatile memory including a plurality of blocks; and
a controller configured to:
execute a first process, the first process being a process for a garbage collection and being divided into a plurality of second processes, each said second process including reading valid data from a first block of the nonvolatile memory and writing the read valid data into a second block of the nonvolatile memory, the first block being a block including valid data and invalid data among the plurality of blocks, the second block being a block that is different from the first block among the plurality of blocks,
during the execution of the first process and one of the plurality of second processes, and in response to a first command received from a host:
determine a first time, the first command being a command requesting an end of the first process, the first time being a time until said one of the plurality of second processes being executed is completed, and
determine a first number, the first number being a number of free blocks to be acquired upon completion of said one second process being executed, and
send the determined first time and the determined first number to the host.

10. The memory system according to claim 9, wherein the controller is configured to:
when the first command is received from the host, determine a second time that is a. time until the first process is completed, and
send the determined second time to the host.

11. The memory system according to claim 10, wherein the controller is configured to:
determine a second number, the second number being a number of free blocks to be acquired upon completion of the first process, and
send the determined second number to the host.

12. The memory system according to claim 9, wherein the controller is further configured to:
during the execution of said one second process, and in response to the first command received from the host again, abort the first process without completing said one second process being executed.

13. The memory system according to claim 9, wherein the controller is further configured to:
in response to a second command received from the host after sending the determined first time to the host, the second command being a command for permitting execution of said one second process being executed, complete said one second process being executed.

14. The memory system according to claim 9, wherein the controller is further configured to:
in response to a third command received from the host after sending the determined first time to the host, the third command being a command for permitting execution of the first process, complete the first process.

15. A method of controlling a nonvolatile memory including a plurality of blocks, the method comprising:
executing a first process, the first process being a process for a garbage collection and being divided into a plurality of second processes, each said second process including reading valid data from a first block of the nonvolatile memory and writing the read valid data into a second block of the nonvolatile memory, the first block being a block including valid data and invalid data among the plurality of blocks, the second block being a block that is different from the first block among the plurality of blocks;
during the execution of the first process and one of the plurality of second processes, and in response to a first command received from a host:
determining a first time, the first command being a command requesting an end of the first process, the first time being a time until one of the plurality of second processes being executed is completed,
determine a first number, the first number being a number of free blocks to be acquired upon completion of said one second process being executed, and
sending the determined first time and the determined first number to the host; and
in a case where the determined first time does not exceed a first threshold, completing said one second process being executed, and not executing another second process to abort the first process.

16. The method according to claim 15, further comprising:
transmitting a response indicating the end of the first process to the host after aborting the first process.

17. The method according to claim 15, further comprising:
in a case where the determined first time exceeds the first threshold, aborting the first process without completing said one second process being executed.

18. The method according to claim 15, wherein each said second process includes:
reading valid data from the first block of the nonvolatile memory;
writing the read valid data into the second block of the nonvolatile memory; and
erasing data of the first block from which the valid data is read.

19. The method according to claim 15, further comprising managing a correspondence between a logical address and a physical address of the nonvolatile memory,
wherein each said second process includes:
reading valid data from the first block of the nonvolatile memory;
writing the read valid data into the second block of the nonvolatile memory;
invalidating a correspondence between a first logical address and a physical address in the first block from which the valid data has been read; and
validating a correspondence between the first logical address and a physical address in the second block into which the valid data is written.

* * * * *